(12) United States Patent
Lin

(10) Patent No.: US 9,161,446 B2
(45) Date of Patent: Oct. 13, 2015

(54) MICRO ELECTRONIC COMPONENT STRUCTURE

(71) Applicant: DAWNING LEADING TECHNOLOGY INC., Miaoli County (TW)

(72) Inventor: Diann Fang Lin, Miaoli County (TW)

(73) Assignee: DAWNING LEADING TECHNOLOGY INC, Miaoli County (TW)

( * ) Notice: Subject to any disclaimer, the term of this patent is extended or adjusted under 35 U.S.C. 154(b) by 0 days.

(21) Appl. No.: 14/160,452

(22) Filed: Jan. 21, 2014

(65) Prior Publication Data
US 2014/0202754 A1    Jul. 24, 2014

(30) Foreign Application Priority Data
Jan. 21, 2013   (TW) .............................. 102201309 U

(51) Int. Cl.
*H05K 1/11*    (2006.01)
*H05K 1/16*    (2006.01)
*H05K 3/34*    (2006.01)

(52) U.S. Cl.
CPC .................. *H05K 1/115* (2013.01); *H05K 1/16* (2013.01); *H01H 2207/04* (2013.01); *H01H 2227/018* (2013.01); *H05K 3/3436* (2013.01); *H05K 2201/09472* (2013.01); *H05K 2201/09563* (2013.01); *H05K 2201/1031* (2013.01); *H05K 2201/10053* (2013.01); *H05K 2201/10265* (2013.01)

(58) Field of Classification Search
USPC .......................................... 174/264, 263, 265
See application file for complete search history.

(56) References Cited

U.S. PATENT DOCUMENTS

2003/0074031 A1*   4/2003   Ley et al. ........................ 607/37
2012/0199389 A1*   8/2012   Furutani et al. ............... 174/264

* cited by examiner

*Primary Examiner* — Andargie M Aychillhum
(74) *Attorney, Agent, or Firm* — Raymond Y. Chan; David and Raymond Patent Firm

(57) ABSTRACT

A micro electronic component structure includes an insulating body, at least one conductive through hole, at least one conductive material, and at least one micro terminal. The insulating body has a top surface and a bottom surface. The conductive through hole penetrates the top surface and the bottom surface. The conductive material is formed in the conductive through hole. The micro terminal is disposed above the conductive material.

16 Claims, 6 Drawing Sheets

MICRO ELECTRONIC COMPONENT STRUCTURE

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

CROSS REFERENCE OF RELATED APPLICATION

This Non-provisional application claims priority under 35 U.S.C. §119(a) on Patent Application No(s). 102201309 filed in Taiwan, Republic of China 201320046425.7, the entire contents of which are hereby incorporated by reference.

BACKGROUND OF THE PRESENT INVENTION

1. Field of Invention

This invention relates to an electrical connection interface and, more particularly, to an electronic component structure of composite multi-factor deformation characteristics formed by a micro terminal made of an elastic material and a bonding material with an elastic effect.

2. Description of Related Arts

Currently, the most common hot-plug interface of a computer in the market is the universal serial bus (USB), and most of external devices are connected with the computer with USB 2.0 plugs. With the development in science and technology, the signal transmission specification of USB is developed from USB 2.0 to USB 3.0. Compared with the transfer rate of 480 Mbps for USB 2.0, the transfer rate of 5 Gbps for USB 3.0 greatly improves the data transfer rate.

The transmission interface of USB 3.0 for an electronic device has two different types of pins. Currently, in manufacture, a substrate is first provided, and a pin module including all single-pins is manufactured independently. After the pin module is manufactured, it is jointed to the substrate to form a transmission interface compatible with USB 2.0 and USB 3.0. However, if the pin module with two different types of pins is needed, compared with a common planar pin module, the manufacture process is more complex and more materials are needed due to greater structural variation and height difference. Further, after the conventional USB pin is pulled and plugged repeatedly, electrical contact may become poor due to improper force and collision deformation or due to elastic fatigue of the pin.

SUMMARY OF THE PRESENT INVENTION

One objective of the invention is to provide a micro electronic component structure with a simple structure, easy manufacture, and a high reliability.

To achieve the above objective, a micro electronic component structure in the invention includes an insulating body, at least one conductive through hole, at least one conductive material, and at least one micro terminal. The insulating body has a top surface and a bottom surface. The conductive through hole penetrates the top surface and the bottom surface. The conductive material is formed in the conductive through hole. The micro terminal is disposed above the conductive material.

In one embodiment of the invention, the diameter of the conductive through hole corresponding to the bottom surface may be greater than that corresponding to the top surface.

In one embodiment of the invention, the conductive material may form a concave structure adjacent to the top surface.

In one embodiment of the invention, the micro terminal may include a contact pad and a joint element connected with the contact pad.

In one embodiment of the invention, the contact pad may be a convex structure and be connected with the bottom of the joint element.

In one embodiment of the invention, the joint element may be a convex structure or a planar structure.

In one embodiment of the invention, the micro terminal may be bonded or welded to the top surface.

In one embodiment of the invention, the micro terminal may include a bonding material formed on the bottom of the joint element for being bonded to the top surface.

In one embodiment of the invention, the micro electronic component structure may further include a substrate connected with the bottom surface.

In one embodiment of the invention, the micro electronic component structure may further include at least one connecting pad disposed at the substrate and corresponding to the conductive material.

In one embodiment of the invention, the substrate may include a printed circuit board or a COB (chip on board) package type circuit board.

In the invention, the electronic component structure of composite multi-factor deformation characteristics is formed by the micro terminal made of an elastic material and the bonding material with an elastic effect. The terminal without pins is used to avoid elastic fatigue and deformation under long-time operation due to the single elastic coefficient. Further, since the bonding material forms a sealed cyclic structure and the internal gas is compressed, the deformed structure is supported in a vapor-pressure type additionally, thus prolonging the life span of the electronic component structure. In addition, in the invention, the size of the conductive material on the bottom surface of the insulating body can be adjusted according to the area of the bottom surface of the insulating body to provide a maximum jointing area with the connecting pad, thus improving the stability of the electrical connection to provide reliability of the product in use.

DETAILED DESCRIPTION OF THE PREFERRED EMBODIMENT

These and other features, aspects, and advantages of the present invention will become better understood with regard to the following description, appended claims, and accompanying drawings. In the following embodiments, a micro electronic component interface is taken for example. However, the invention is not limited thereto, and other connection interface can also be applied.

Figure 1:
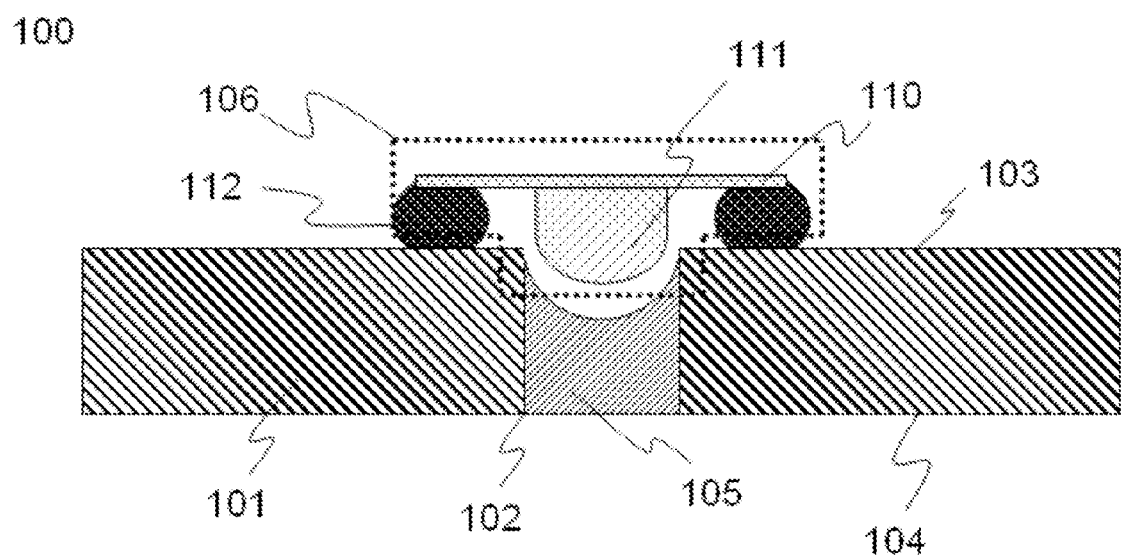
FIG. 1 is a schematic diagram of a micro electronic component structure according to a first embodiment of the invention.

Please refer to FIG. 1. A micro electronic component structure 100 in a first embodiment of the invention includes an insulating body 101, at least one through hole 102, at least one conductive material 105, and least one micro terminal 106. The insulating body 101 has a top surface 103 and a bottom surface 104. The conductive through hole 102 penetrates the top surface 103 and the bottom surface 104. The conductive material 105 is formed in the conductive through hole 102. The micro terminal 106 is disposed above the conductive material 105.

The conductive material 105 is formed in the conductive through hole 102 and forms a concave structure adjacent to the top surface 103; further, the top of the conductive material 105 is exposed to the top surface 103 of the insulating body 101. Similarly, the bottom of the conductive material 105 is exposed to the bottom surface 104 of the insulating body 101 to allow the micro terminal 106 to be electrically connected with other electronic components.

In the embodiment, the micro terminal 106 includes a contact pad 111 and a joint element 110 connected with the contact pad 111. The contact pad 111 is a convex structure and is connected with the bottom of the joint element 110. In addition, the joint element 110 may be a convex structure or a planar structure. In the embodiment, the micro terminal 106 may include the planar joint element 110 and the convex contact pad 111, and the contact pad 111 is connected with the bottom of the joint element 110. The conductive material 105 is formed in the conductive through hole 102 and forms a concave structure adjacent to the top surface 103 to meet the pattern of the contact pad 111.

The micro terminal 106 may be bonded or welded to the top surface 103 of the insulating body 101. In the embodiment, the micro terminal 106 includes a bonding material 112 formed on the bottom of the joint element 110 for being bonded to the top surface 103. The bonding material 112 is disposed around the conductive through hole 102 on the top surface 103 and forms a sealed space with the bottom of the joint element 110. In terms of a plurality of micro terminals 106 disposed at the insulating body 101, the micro terminal 106 is disposed corresponding to the conductive through hole 102 and the conductive material 105.

Figure 2:
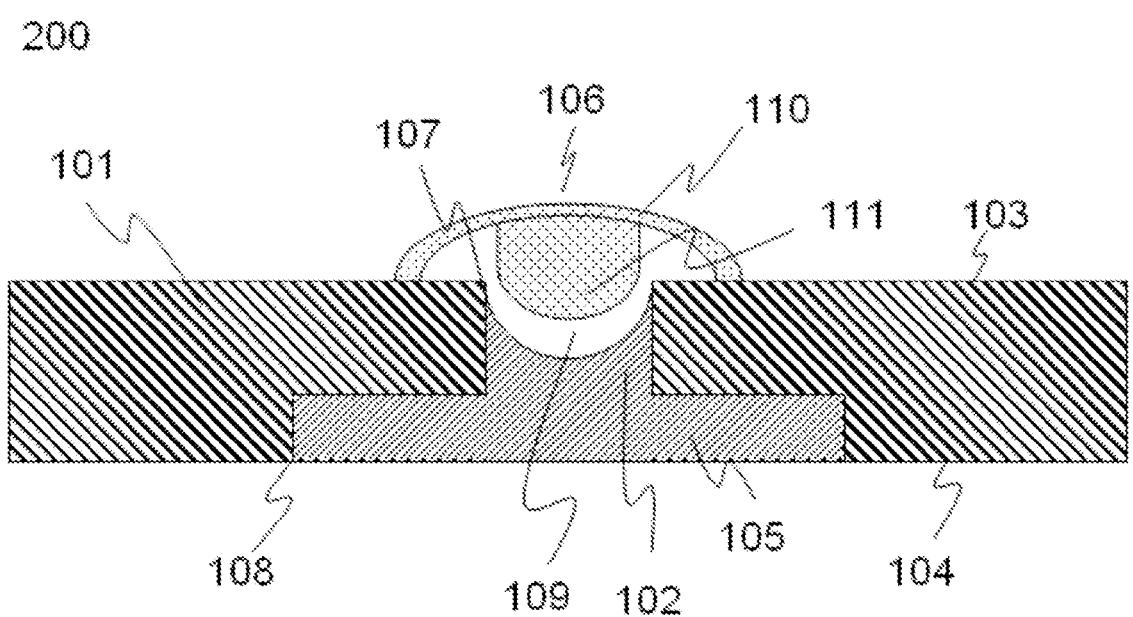
FIG. 2 is a schematic diagram of a micro electronic component structure according to a second embodiment of the invention.

Please refer to FIG. 2. A micro electronic component structure 200 in a second embodiment of the invention includes an insulating body 101, at least one conductive through hole 102, at least one conductive material 105, and at least one micro terminal 106. The micro terminal 106 is disposed at the insulating body 101 in the method similar to the first embodiment, and it is not described for a concise purpose. In the embodiment, the diameter 108 of the conductive through hole 102 corresponding to the bottom surface 104 is greater than the diameter 107 of the conductive through hole 102 corresponding to the top surface 103. Further, the convex joint element 110 is taken for example, and the contact pad 111 is connected with the bottom of the joint element 110. Similarly, the conductive material 105 forms a concave structure 109 adjacent to the top surface 103.

Figure 3:
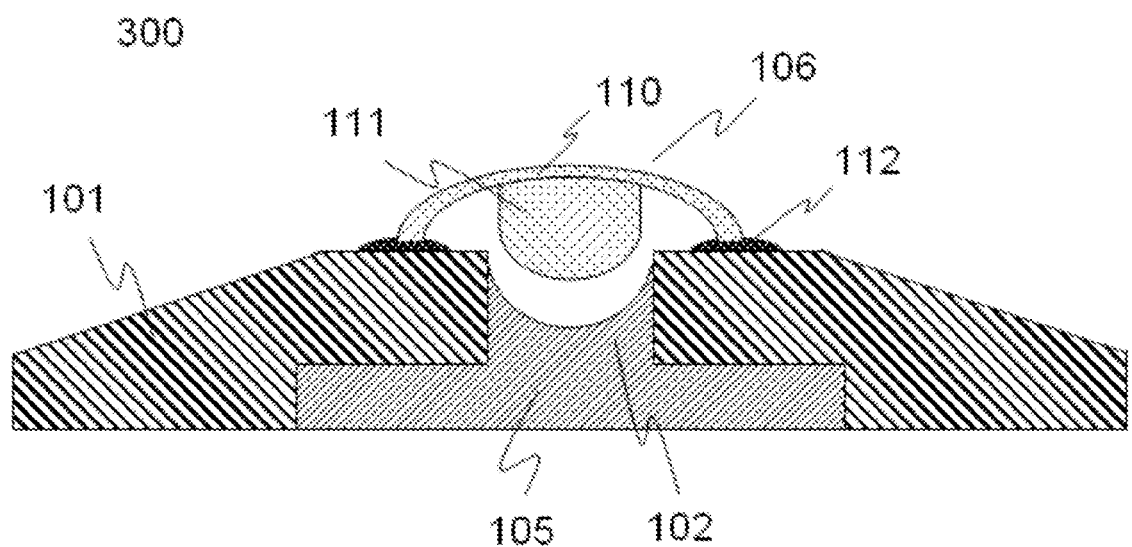
FIG. 3 is a schematic diagram of a micro electronic component structure according to a third embodiment of the invention.
Figure 4:
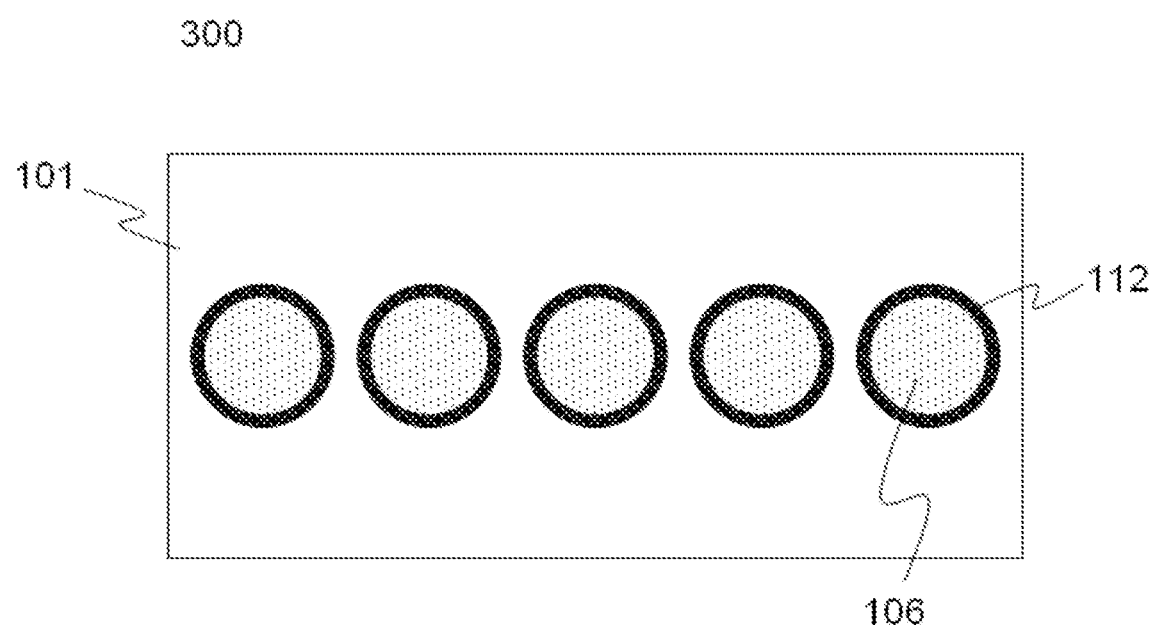
FIG. 4 is a top view of the micro electronic component structure according to the third embodiment of the invention.

Please refer to FIG. 3 and FIG. 4. A micro electronic component structure 300 in a third embodiment of the invention includes an insulating body 101, at least one conductive through hole 102, at least one conductive material 105, and at least one micro terminal 106. The micro terminal 106 is disposed at the insulating body 101 in the method similar to the second embodiment. The difference between this embodiment and the second embodiment lies in the appearance of the insulating body which can be adjusted according to the actual product needs; further, the micro electronic component structure 300 can be a modular structure to facilitate the application of related products.

Figure 5:
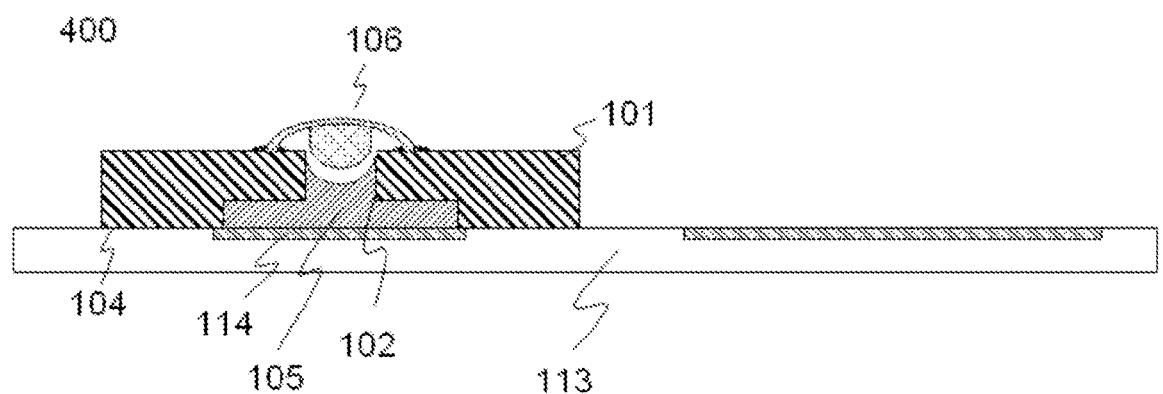
FIG. 5 is a schematic diagram of a micro electronic component structure according to a fourth embodiment of the invention.
Figure 6:
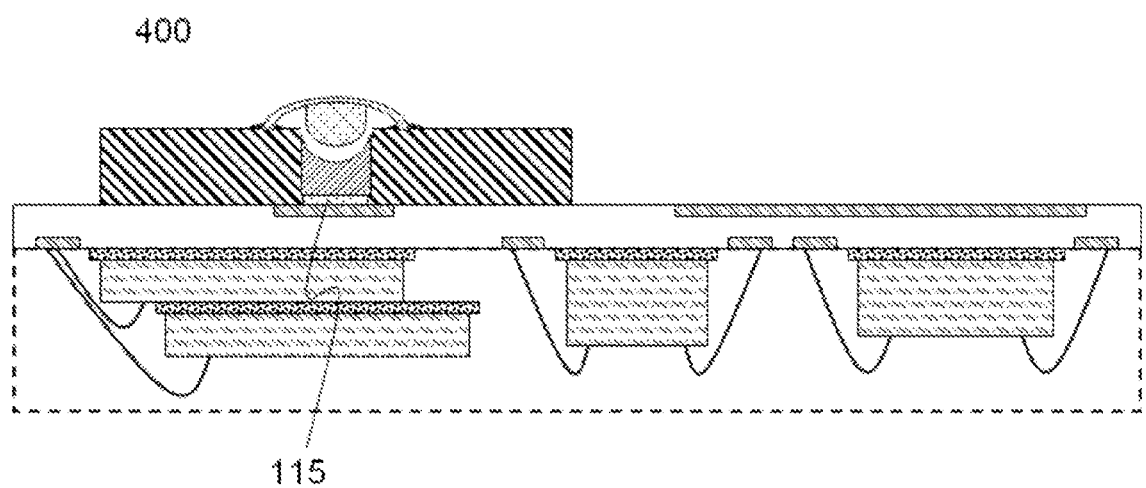
FIG. 6 is another schematic diagram of the micro electronic component structure according to the fourth embodiment of the invention.

Please refer to FIG. 5 and FIG. 6. A micro electronic component structure 400 in a fourth embodiment of the invention includes an insulating body 101, at least one conductive through hole 102, at least one conductive material 105, and at least one micro terminal 106.

The micro terminal 106 is disposed at the insulating body 101 in the method similar to the first embodiment, and it is not described for a concise purpose. In the embodiment, the micro electronic component structure 400 further includes a substrate 113 connected with the bottom surface 104. Further, the micro electronic component structure 400 further includes at least one connecting pad 114 disposed at or embedded in the substrate 113. The connecting pad 114 is disposed corresponding to the conductive material 105 for an electrical connection. Further, in the embodiment, the connecting pad 114 has an adhesive layer 115 formed thereon to enhance the connection strength between the micro electronic component structure 400 and the connecting pad 114. In addition, the substrate 113 includes a printed circuit board or a COB (chip on board) package type circuit board.

To sum up, in the embodiments of the invention, the electronic component structure of composite characteristics is formed by the micro terminal made of an elastic material and the bonding material with a multi-factor deformation effect. The terminal without pins is used to avoid elastic fatigue and deformation under long-time operation due to the single elastic coefficient. Further, since the bonding material forms a sealed cyclic structure and the internal gas is compressed, the deformed structure is supported additionally, thus prolonging the life span of the electronic component structure. In addition, in the embodiments of the invention, the size of the conductive material on the bottom surface of the insulating body can be adjusted according to the area of the bottom surface of the insulating body to provide a maximum jointing area with the connecting pad, thus improving the stability of the electrical connection to provide reliability of the product in use.

In the embodiments of the invention, the deformation characteristic of the micro terminal itself and the bonding material formed around the conductive through hole and connected with the bottom of the contact pad of the micro terminal provide a dual elasticity needed by the micro terminal together thus to improve reliability of the product. The bonding material fully bonds the insulating body and the joint element thus to avoid poor contact due to the convex structure and oxidation of the conductive material. Further, the concave structure formed on the top of the conductive material can provide a friction force to maintain an efficient electrical connection between the conductive material and the micro terminal. Accordingly, compared with the conventional contact type elastic terminal, the micro electronic component structure in the embodiments of the invention can avoid the poor electrical connection and the defect in manufacture due to the structure deformation or the elastic fatigue.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A micro electronic component structure, comprising:
an insulating body having a top surface, a bottom surface, at least a conductive through hole formed at said insulating body and penetrated through said top surface and said bottom surface;
at least a conductive material formed in said conductive through hole at a position that a top of said conductive material is exposed to said top surface of said insulating body and a bottom of said conductive material is exposed and located at said bottom surface of said insulating body; and
at least a micro terminal disposed above said conductive material, wherein said micro terminal comprises a joint element coupled at said top surface of said insulating body and a contact pad downwardly extended from said joint element toward said top of said conductive material, wherein said micro terminal has deformation characteristic and provides an elastic ability to ensure a bottom surface of said contact pad to contact with said top of said conductive material.

2. The micro electronic component structure, as recited in claim 1, wherein said top of said conductive material has a concave surface, wherein said bottom surface of said contact pad is a convex surface corresponding to said concave surface of said top of said conductive material, so as to maximize a contacting area therebetween.

3. The micro electronic component structure, as recited in claim 2, wherein a diameter of said conductive through hole at said bottom surface of said insulating body is larger than a diameter of said conductive through hole at said top surface of said insulating body, such that a size of said bottom of said conductive material is enlarged at said conductive through hole to maximize a jointing area of said bottom of said conductive material.

4. The micro electronic component structure, as recited in claim 3, further comprising a substrate coupled at said bottom surface of said insulating body and electrically linked to said bottom of said conductive material.

5. The micro electronic component structure, as recited in claim 4, further comprising a connecting pad provided between said substrate and said bottom of said conductive material, wherein said connecting pad comprises an adhesive layer formed between said substrate and said bottom of said conductive material to enhance a connection strength therebetween.

6. The micro electronic component structure, as recited in claim 5, wherein said substrate comprises a printed circuit board or a COM (chip on board) package type circuit board.

7. The micro electronic component structure, as recited in claim 1, wherein said joint element has a convex structure to be coupled at said top surface of said insulating body.

8. The micro electronic component structure, as recited in claim 7, wherein said joint element is directly bonded at said top surface of said insulating body to air-seal an internal gas within said conductive through hole and between said bottom surface of said contact pad and said top of said conductive material.

9. The micro electronic component structure, as recited in claim 1, wherein said joint element has a planar structure to be coupled at said top surface of said insulating body.

10. The micro electronic component structure, as recited in claim 9, wherein said joint element is directly bonded at said top surface of said insulating body to air-seal an internal gas within said conductive through hole and between said bottom surface of said contact pad and said top of said conductive material.

11. The micro electronic component structure, as recited in claim 9, wherein said joint element is welded at said top surface of said insulating body via an elastic bonding element to air-seal an internal gas within said conductive through hole and between said bottom surface of said contact pad and said top of said conductive material.

12. The micro electronic component structure, as recited in claim 7, wherein said joint element is welded at said top surface of said insulating body via an elastic bonding element to air-seal an internal gas within said conductive through hole and between said bottom surface of said contact pad and said top of said conductive material.

13. The micro electronic component structure, as recited in claim 1, wherein a diameter of said conductive through hole at said bottom surface of said insulating body is larger than a diameter of said conductive through hole at said top surface of said insulating body, such that a size of said bottom of said conductive material is enlarged at said conductive through hole to maximize a jointing area of said bottom of said conductive material.

14. The micro electronic component structure, as recited in claim 1, further comprising a substrate coupled at said bottom surface of said insulating body and electrically linked to said bottom of said conductive material.

15. The micro electronic component structure, as recited in claim 14, further comprising a connecting pad provided between said substrate and said bottom of said conductive material, wherein said connecting pad comprises an adhesive layer formed between said substrate and said bottom of said conductive material to enhance a connection strength therebetween.

16. The micro electronic component structure, as recited in claim 14, wherein said substrate comprises a printed circuit board or a COM (chip on board) package type circuit board.

* * * * *